United States Patent [19]

Marchisi

[11] Patent Number: 5,102,828
[45] Date of Patent: Apr. 7, 1992

[54] METHOD FOR MANUFACTURING A SEMICONDUCTOR CARD WITH ELECTRICAL CONTACTS ON BOTH FACES

[75] Inventor: Giuseppe Marchisi, Milan, Italy

[73] Assignee: SGS-Ates Componenti Elettronici S.p.a., Catania, Italy

[21] Appl. No.: 340,696

[22] Filed: Apr. 20, 1989

Related U.S. Application Data

[60] Division of Ser. No. 310,029, Feb. 8, 1989, Pat. No. 4,032,894, which is a continuation of Ser. No. 505,327, Jun. 17, 1983, abandoned.

[30] Foreign Application Priority Data

Mar. 9, 1983 [IT] Italy .............................. 19963 A/83

[51] Int. Cl.$^5$ ........................................... H01L 23/48
[52] U.S. Cl. .................................. 437/211; 437/217; 437/220; 437/216; 361/398; 29/835; 264/272.17
[58] Field of Search ..................... 357/70, 72, 68, 74, 357/80; 437/209, 211, 206, 216, 217, 220, 207; 235/487, 492; 361/398; 29/834, 835, 836, 827; 264/272.17

[56] References Cited

U.S. PATENT DOCUMENTS

| | | |
|---|---|---|
| 3,628,105 | 12/1971 | Sakai et al. |
| 4,066,851 | 1/1978 | White et al. ............. 361/398 |
| 4,147,889 | 4/1979 | Andrews et al. |
| 4,307,438 | 12/1981 | Grubb ..................... 361/428 |
| 4,849,617 | 7/1989 | Ueda ....................... 235/492 |

Primary Examiner—Olik Chaudhuri
Assistant Examiner—Andrew Griffis
Attorney, Agent, or Firm—Cushman, Darby & Cushman

[57] ABSTRACT

Two superimposed series of electric contacts in the shape of metal-sheet strips, electrically connected to a metallic place which supports a semiconductor chip, are electrically separated but mechanically connected by an interposed layer of adhesive material at high insulation. The whole is completely inserted in a covering of insulating material, which forms a flat support, from which, at opposite faces, only limited adjacent contact portions of said electric contacts emerge.

The place and at least one of the two series of contacts make part of a single starting metallic frame, on which the other series of contacts is superimposed. This latter in its turn can make part of the same metallic frame and to be superimposed by refolding or can be prepared separately and then applied on the first series.

7 Claims, 1 Drawing Sheet

METHOD FOR MANUFACTURING A SEMICONDUCTOR CARD WITH ELECTRICAL CONTACTS ON BOTH FACES

BACKGROUND OF THE INVENTION

This is a division of Application 07/310,029, filed Feb. 8, 1989, now U.S. Pat. No. 5,032,894 which was a continuation of Application No. 06/505,327, filed Jun. 17, 1983, now abandoned. The present invention relates to a flat-card-shaped semiconductor device with electric contacts on both faces.

There are known and used, especially in the field of television electronic games, card-shaped semiconductor devices, where on both faces of an insulating support of glass fiber and epoxy resin there are formed by superficial metallization respective series of electric contacts connected to a semiconductor chip deposited and encapsulated on a face of the same insulating support.

Such known devices present the disadvantage of being too expensive, especially as a consequence of the high cost of the insulating support and of the laboriousness of the formation process of the electric contacts.

SUMMARY OF THE INVENTION

The object of the present invention is to provide a semiconductor device of flat-card kind with electric contacts on the two opposite faces, which is less expensive than those presently known which have been previously mentioned.

According to the invention such a semiconductor device comprises a flat insulating support, a semiconductor chip and two superimposed series of electric contacts, characterized in that said electric contacts are constituted by sheet-metal strips electrically connected to a metallic support plate for the semiconductor chip and said flat support comprises a layer of insulating adhesive material interposed between the two series of electric contacts and a covering package of insulating material from which, at opposite faces of said flat support, only limited adjacent contact portions of said electric contacts emerge.

Always according to the invention it is provided that the above mentioned device is manufactured by a process which provides for the use, as starting element, of a flat metallic frame including a support place for the semiconductor chip and at least one first series of electric contacts in the shape of metal-sheet strips, the deposition of the semiconductor chip on said place, the superimposition of a second series of electric contacts in the shape of metal-sheet strips on said first series with interposition of a layer of adhesive material at high insulation and finally the realization of a covering of insulating material to form a flat support or package from which, at opposite faces, only limited adjacent contact portions of said electric contacts emerge.

It is also provided that, in practical realization of the above mentioned process, the second series of contacts is either contained in the same starting metallic frame, on the opposite part with respect to the first series, and then refolded on the first one, or separately prepared and then applied on the first one. It is clear that they are two completely equivalent solutions.

From comparative tests, it has appeared that the device according to the invention, for its shape and for its manufacture way, is less expensive than known devices. This is especially due to the fact that there is no expensive preformed card, but rather there are more simple constructive elements, such as metallic frames which can be obtained by shearing, the cost of which is relatively low. In addition, the difficult process of deposition of the electric contacts on a preformed card are avoided.

Further, the device according to the invention. offers greater reliability due to the fact that the whole system of contacts is included in the insulating covering, except for the contact portions.

Finally the device according to the invention offers the same cost and reliability advantages of the normal integrated circuits of the so called "dual-in-line" kind, having with respect to them the quality of the flat card conformation, in many cases useful for its reduced bulk and the ready substitution in case of necessity.

BRIEF DESCRIPTION OF THE DRAWING

The characteristics and the advantages of the present invention will be made more evident by the following detailed description of an embodiment illustrated by way of non-limitative example in the enclosed drawings, in which.

DETAILED DESCRIPTION

Figure 1:
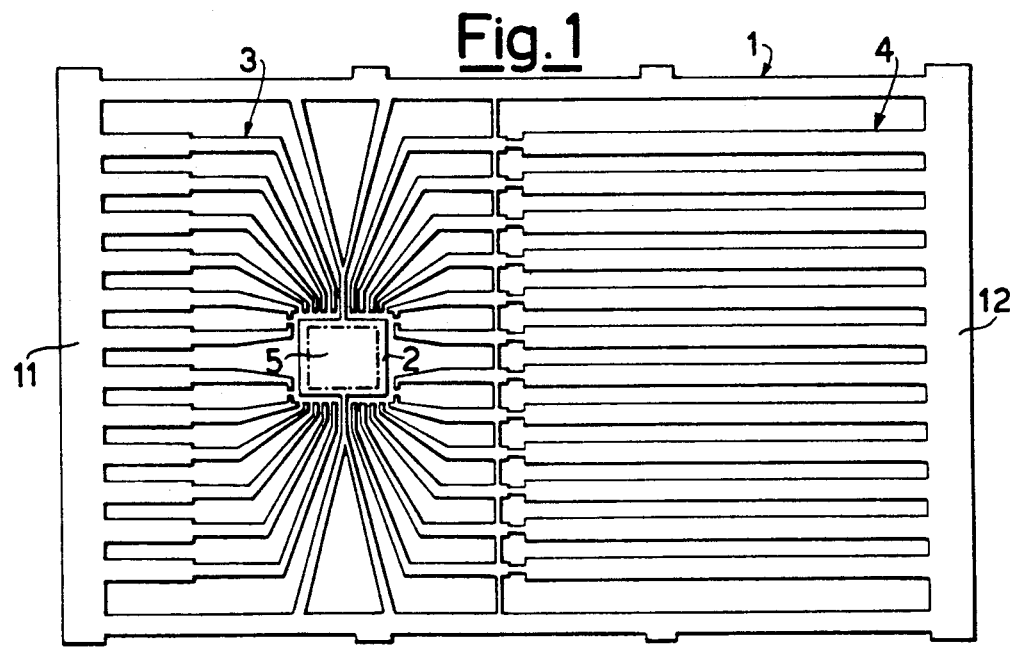
FIG. 1 shows in top plan view a metallic frame with two contact series, which frame constitutes the starting element for obtaining a semiconductor device according to the invention.

With reference to FIG. 1, there is illustrated a flat metallic frame 1, wherein there are formed by shearing a plate 2 for receiving a semiconductor chip 5 and two opposite series of electric contacts 3 and 4 formed in the shape of thin metal-sheet strips converging towards the plate 2.

Once a semiconductor chip 5 has been deposited and fixed on the plate 2 and then electrically connected to the electric contacts 3 and 4 by means of thin conducting filaments 6 and 7 (FIGS. 1 and 2), the part of the frame 1 which comprises the contacts 4 is folded under the plate 2 and under the contacts 3, with interposition of a thin layer of insulating adhesive material 8, for example epoxy glue. There are also formed offset terminal portions 9 and 10 (which will serve as external electrical contacts in the finished device) of the contacts 3 and 4, and the ends 11 and 12 of the frame 1 are removed, in order to electrically and mechanically separate the contacts of the series 3 and 4 which are kept in position by the adhesive.

The chip 5 is encapsulated in a suitable resin 13 before or after the folding operation. After the folding operation, the folded frame is covered with epoxy resin 14, taking care to leave emerging from the so obtained container or plane "package" (in addition to the encapsulated chip) only the contact portions 9 and 10 of the electric contacts 3 and 4, distributed in two series on the opposite faces of the card (FIGS. 3 and 4).

Figure 3:
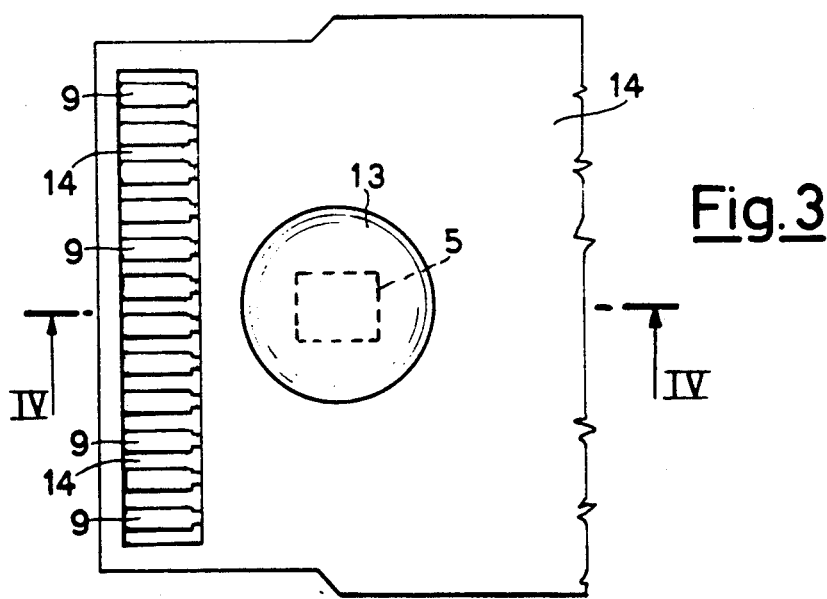
FIG. 3 shows a top plan the semiconductor device at the end of the fabrication process.
Figure 4:
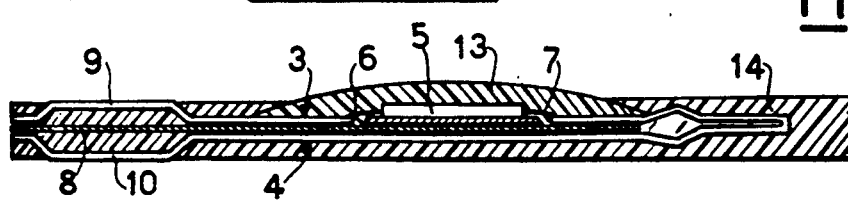
FIG. 4 shows said device in section along line IV—IV of FIG. 3.

There is thus obtained a semiconductor device in the shape of a flat card, which, as illustrated in FIGS. 3 and 4, contains an encapsulated semiconductor chip and leaves emerging from the two opposite faces of the container or "package" 14 two respective series of terminal portions 9 and 10 of electric contacts which are otherwise completely embedded in the resin.

Figure 2:
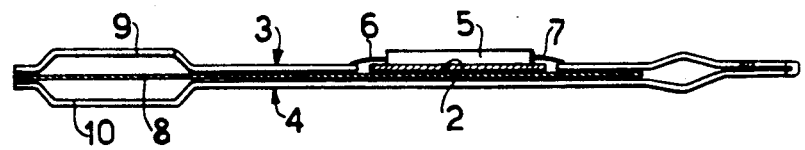
FIG. 2 shows said frame in section after it has received the semiconductor chip and after one series of contacts has been folded under the other series with interposition of a layer of insulating adhesive material.

Alternatively to the described process there can be used a metallic frame with a single series of contacts, and the second series of contacts can be applied later under the first one, the same configuration illustrated in FIG. 2.

I claim:

1. A process for manufacturing a flat card shaped semiconductor device having electrical contacts on parallel opposite major faces thereof, comprising:

providing a sheet metal frame defining a support plate for a semiconductor chip and two coplanar pluralities of strip-shaped electrical contacts having respective one ends located near an outer periphery of the support plate and respective other ends located in respective first and second groups away from the outer periphery of the support plate;

mounting a semiconductor chip on said support plate;

electrically connecting certain portions of said semiconductor chip with respective ones of said one ends of said pluralities of electrical contacts;

arranging a layer of electrically insulating material under said support plate and a first one of said pluralities of electrical contacts;

folding the second one of said pluralities of electrical contacts under said support plate and said first plurality of electrical contacts to define a semiconductor device including first and second superimposed pluralities of electrical contacts separated by said layer of electrically insulating material;

forming respective first terminals on said other ends of said first plurality of electrical contacts and respective second terminals on said other ends of said second plurality of electrical contacts, so that said first and second terminals are superimposed upon one another but spaced apart by said layer of electrically insulating material;

encapsulating said first plurality of electrical contacts, said support plate, said semiconductor chip, said layer of electrically insulating material and said second plurality of electrical contacts, except for said first and second terminals, to form a flat package with opposite parallel major faces from which said first and second terminals respectively emerge.

2. The process of claim 1, wherein:

said portions of the semiconductor chip are connected with respective ones of said ones ends of aid pluralities of electrical contacts by respective thin wires.

3. The process of claim 1, wherein:

said folding of said second plurality of electrical contacts is performed along a folding line crossing said second plurality of electrical contacts near said one ends thereof.

4. The process of claim 1, wherein:

said first and second terminals are formed by locally deforming portions of said other ends of said first and second pluralities of electrical contacts so that, upon performing the encapsulation step, said terminals remain free of encapsulation.

5. A process for manufacturing a flat card shaped semiconductor device having electrical contacts on parallel opposite major faces thereof, comprising:

providing a first sheet metal frame defining a support plate for a semiconductor chip and a first plurality of strip-shaped electrical contacts having respective one ends located near an outer periphery of the support plate and respective other ends located in a first group away from the outer periphery of the support plate;

providing a second sheet metal frame defining a second plurality of strip-shaped electrical contacts having respective one ends and respective other ends located in a second group;

mounting a semiconductor chip on said support plate;

electrically connecting certain portions of said semiconductor chip with respective ones of said one ends of said first and second pluralities of electrical contacts;

arranging a layer of electrically insulating material under said first sheet metal frame;

arranging said second sheet metal frame under said first metal frame to define a semiconductor device including first and second superimposed pluralities of electrical contacts separated by said layer of electrically insulating material;

forming respective first terminals on said other ends of said first plurality of electrical contacts and respective second terminals on said other ends of said second plurality of electrical contacts, so that said first and second terminals are superimposed upon one another but spaced apart by said layer of electrically insulating material;

encapsulating said first plurality of electrical contacts, said support plate, said semiconductor chip, said layer of electrically insulating material and said second plurality of electrical contacts, except for said first and second terminals, to form a flat package with opposite parallel major faces from which said first and second terminals respectively emerge.

6. The process of claim 5, wherein:

said portions of the semiconductor chip are connected with respective ones of said one ends of said pluralities of electrical contacts by respective thin wires.

7. The process of claim 5, wherein:

said first and second terminals are formed by locally deforming portions of said other ends of said first and second pluralities of electrical contacts so that, upon performing the encapsulation step, said terminals remain free of encapsulation.

* * * * *